United States Patent
Jia et al.

(10) Patent No.: US 12,501,579 B2
(45) Date of Patent: Dec. 16, 2025

(54) HEAT DISSIPATION APPARATUS AND PROCESSOR

(71) Applicant: HUAWEI TECHNOLOGIES CO., LTD., Guangdong (CN)

(72) Inventors: Hui Jia, Dongguan (CN); Jiyang Li, Dongguan (CN); Chao Wang, Yokohama (JP)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 217 days.

(21) Appl. No.: 17/538,881

(22) Filed: Nov. 30, 2021

(65) Prior Publication Data
US 2022/0087050 A1 Mar. 17, 2022

Related U.S. Application Data

(63) Continuation of application No. PCT/CN2019/130742, filed on Dec. 31, 2019.

(30) Foreign Application Priority Data

May 31, 2019 (CN) .......................... 201910469769.0

(51) Int. Cl.
H05K 7/20 (2006.01)

(52) U.S. Cl.
CPC ..... *H05K 7/20236* (2013.01); *H05K 7/20272* (2013.01)

(58) Field of Classification Search
CPC ........... H05K 7/20236; H05K 7/20272; H05K 7/20218; H05K 7/20318; H05K 7/2029
See application file for complete search history.

(56) References Cited

U.S. PATENT DOCUMENTS

| | | | |
|---|---|---|---|
| 4,704,658 A | 11/1987 | Yokouchi et al. | |
| 8,014,150 B2 * | 9/2011 | Campbell | H05K 7/20809 165/185 |

(Continued)

FOREIGN PATENT DOCUMENTS

| | | |
|---|---|---|
| CN | 102625639 A | 8/2012 |
| CN | 102980416 A | 3/2013 |

(Continued)

OTHER PUBLICATIONS

Morito Matsuoka et al, Liquid immersion cooling technology with natural convection in data center, 2017 IEEE 6th International Conference on Cloud Networking (CloudNet), 7 pages.

*Primary Examiner* — Jayprakash N Gandhi
*Assistant Examiner* — Matthew Sinclair Muir

(57) ABSTRACT

A heat dissipation apparatus is provided. The heat dissipation apparatus includes an immersion tank. The immersion tank accommodates a liquid medium. When being used, the board is immersed in the liquid medium, and the liquid medium dissipates heat for the board by absorbing heat. The heat dissipation apparatus further includes a condenser immersed in the liquid medium. The condenser is disposed to dissipate heat for the liquid medium. Heat of the board is transferred to the condenser in the immersion tank by using the liquid medium in the immersion tank as a medium. Then the condenser takes away and dissipates the heat by using a cooling apparatus that is connected to the condenser and that is configured to perform heat exchange for the condenser.

14 Claims, 7 Drawing Sheets

(56) References Cited

U.S. PATENT DOCUMENTS

| | | | |
|---|---|---|---|
| 9,464,854 B2 * | 10/2016 | Shelnutt | F28F 27/02 |
| 9,773,526 B2 | 9/2017 | Shelnutt et al. | |
| 10,015,905 B2 * | 7/2018 | Watanabe | H01L 23/473 |
| 10,149,408 B2 * | 12/2018 | Fujiwara | H05K 7/20318 |
| 10,888,032 B2 * | 1/2021 | Wakino | H01L 23/427 |
| 11,116,113 B2 * | 9/2021 | Chiu | H05K 7/2039 |
| 2014/0216686 A1 | 8/2014 | Shelnutt et al. | |
| 2016/0147034 A1 | 5/2016 | Shoujiguchi et al. | |
| 2016/0366792 A1 * | 12/2016 | Smith | H05K 7/2079 |
| 2017/0311484 A1 | 10/2017 | Ozyalcin et al. | |
| 2018/0070477 A1 * | 3/2018 | Saito | H01L 23/473 |
| 2018/0092243 A1 | 3/2018 | Saito | |
| 2018/0246550 A1 * | 8/2018 | Inaba | H05K 7/20254 |
| 2018/0279507 A1 | 9/2018 | Midgley et al. | |

FOREIGN PATENT DOCUMENTS

| | | |
|---|---|---|
| CN | 104597994 A | 5/2015 |
| CN | 104991623 A | 10/2015 |
| CN | 106445037 A | 2/2017 |
| CN | 106659083 A | 5/2017 |
| CN | 106959737 A | 7/2017 |
| CN | 107949257 A | 4/2018 |
| CN | 108811472 A | 11/2018 |
| CN | 109195424 A | 1/2019 |
| CN | 109757060 A | 5/2019 |

* cited by examiner

HEAT DISSIPATION APPARATUS AND PROCESSOR

CROSS-REFERENCE TO RELATED APPLICATIONS

This application is a continuation of International Application No. PCT/CN2019/130742, filed on Dec. 31, 2019, which claims priority to Chinese Patent Application No. 201910469769.0, filed on May 31, 2019. The disclosures of the aforementioned applications are hereby incorporated by reference in their entireties.

TECHNICAL FIELD

This application relates to the field of communications technologies, and in particular, to a heat dissipation apparatus and a processor.

BACKGROUND

As integration of electronic parts and components is improved, power consumption density of a chip also becomes increasingly high, and a conventional air-cooled heat dissipation manner cannot meet an increasing heat dissipation requirement. With its high heat dissipation efficiency, a liquid cooling technology provides a new solution for heat dissipation of electronic parts and components with high heat flux density, and has been applied to the field of data centers, the field of servers, and other fields.

A comparatively common manner in the prior art is to use an immersion liquid cooling technology. The immersion liquid cooling is a form of a liquid cooling technology. A device is immersed in a liquid, and heat of the device is transferred to the liquid and taken away through direct contact with the liquid. During disposing, as shown in FIG. 1, all boards 2 are immersed in a same tank 1, and the tank 1 is filled with a working medium that has a comparatively low boiling point and is subject to a phase change. When encountering a board 2 that generates heat, the working medium liquid absorbs the heat and becomes a gas; when driven by a buoyancy force, the gas naturally rises; when encountering a condenser 3 at the top (above a liquid surface) of the tank 1, the gas condenses into a liquid when cooled; and the liquid drops back into the tank 1 depending on gravity, to form a heat dissipation cycle. However, when the two-phase working medium with a low boiling point is used, the medium is highly volatile and imposes a high requirement on a sealing design of the tank 1. This is difficult to implement in an actual working environment.

SUMMARY

This application provides a heat dissipation apparatus and a processor, to improve an effect of dissipating heat by a heat dissipation apparatus for a board.

According to a first aspect, a heat dissipation apparatus is provided. The heat dissipation apparatus is configured to dissipate heat for a board. During disposing of the heat dissipation apparatus, the heat dissipation apparatus includes an immersion tank. The immersion tank accommodates a liquid medium, and the liquid medium is configured to dissipate heat for the board. When being used, the board is immersed in the liquid medium, and the liquid medium dissipates heat for the board by absorbing heat. In addition, to lower a liquid medium that has absorbed heat, the heat dissipation apparatus further includes a condenser immersed in the liquid medium, and the condenser is disposed to dissipate heat for the liquid medium. After the board generates heat, the heat heats up a liquid medium near the board. Density of the liquid medium decreases after the liquid medium is heated up, and the heated liquid medium rises. After the heated liquid medium gets in contact with the condenser, the heat is transferred to the condenser. After temperature of the liquid medium decreases, the density increases, and the liquid medium sinks to a tank bottom again. In this way, a "natural convection" cycle is formed by using a change relationship between the density and the temperature of the liquid medium, and heat of the board is continuously transferred to the condenser in the immersion tank by using the liquid medium in the immersion tank as a medium. Then the condenser takes away and dissipates the heat by using a cooling apparatus that is connected to the condenser and that is configured to perform heat exchange for the condenser. It can be learned from the foregoing descriptions that in the foregoing embodiment, the heat is directly taken away through backflow of the liquid medium due to the temperature, thereby decreasing a sealing requirement for the heat dissipation apparatus, and ensuring a heat dissipation effect for the board.

During disposing of the immersion tank, the immersion tank includes two parts. One part is a tank body for accommodating the liquid medium, and the other part is a cover connected to the tank body. During disposing of the cover, the cover and the tank body may be of a split structure, or the cover may be connected to the tank body in a rotary manner.

When the condenser is connected to the cooling apparatus, the connection is performed by using a pipe. In a connection, the pipe includes a liquid inlet pipe and a liquid outlet pipe that penetrate the tank body. The liquid inlet pipe is connected to a liquid inlet of the condenser. The liquid outlet pipe is connected to a liquid outlet of the condenser. The liquid inlet pipe and the liquid outlet pipe are separately connected to the cooling apparatus. A liquid flows in the condenser and the cooling apparatus through the liquid inlet pipe and the liquid outlet pipe to form circulation, so as to dissipate heat.

During disposing of the condenser, a quantity of condensers may be disposed as required. One condenser may be disposed in one immersion tank, or a plurality of condensers may be disposed in one immersion tank. For example, in a implementation solution, when there are two or more condensers, liquid inlets of the two or more condensers are connected to the liquid inlet pipe in parallel, and liquid outlets of the two or more condensers are connected to the liquid outlet pipe in parallel.

In a correspondence between a condenser and a board, one condenser may correspond to one board, or one condenser may correspond to two or more boards. During disposing, a layout may be performed according to an actual heat dissipation requirement.

When the board is fastened in the tank body, disposing may be performed in different manners. For example, in a implementation solution, a slot for fastening the board is disposed in the tank body, so that the board can be easily fastened.

During disposing of the slot, one, two, or more slots may be used. In a implementable solution, when there are two or more slots, the two or more slots are arranged in an array.

It can be learned from the foregoing descriptions that when the condenser absorbs heat, the condenser needs to be located above the board. Therefore, in this embodiment of this application, each corresponding condenser is located above a corresponding slot, and each condenser corresponds to at least one slot.

During disposing of the condenser, different disposing manners may be used. For example, each condenser is connected to the tank body in a rotary manner, and when the condenser rotates to a first specified location, the condenser avoids an opening of the slot. The condenser is connected to the tank body in a rotary manner, so that a location of the condenser can be changed. During mounting of the board, the condenser may be rotated to avoid the opening of the slot, so that the board can be easily inserted.

Certainly, in addition to the foregoing manner, another manner may be alternatively used. For example, the immersion tank includes a tank body and a cover connected to the tank body, and each condenser is fixedly connected to the cover of the immersion tank. The condenser is fastened on the cover. When the cover is removed, an opening of a slot can be directly exposed, so that the board can be easily fastened.

During disposing of the cooling apparatus, different apparatuses may be used. For example, the cooling apparatus is an outdoor dry cooler/cooling tower, or an indoor chiller.

In addition, the cooling apparatus may be alternatively an air-cooled heat dissipation module or a natural heat dissipation module.

In addition to the aforementioned technical solutions, the condenser may be alternatively an immersion tank, and a cooler is an external water source. In this case, the immersion tank is immersed in the water source, for example, immersed in a natural water source such as a river or a lake.

According to a second aspect, a processor is provided. The processor includes the heat dissipation apparatus according to any one of the foregoing implementations, and a board inserted into the heat dissipation apparatus. After the board generates heat, the heat heats up a liquid medium near the board. Density of the liquid medium decreases after the liquid medium is heated up, and the heated liquid medium rises. After the heated liquid medium gets in contact with a condenser, the heat is transferred to the condenser. After temperature of the liquid medium decreases, the density increases, and the liquid medium sinks to a tank bottom again. In this way, a "natural convection" cycle is formed by using a change relationship between the density and the temperature of the liquid medium, and heat of the board is continuously transferred to the condenser in an immersion tank by using the liquid medium in the immersion tank as a medium. Then the condenser takes away and dissipates the heat by using a cooling apparatus that is connected to the condenser and that is configured to perform heat exchange for the condenser. It can be learned from the foregoing descriptions that in the foregoing embodiment, the heat is directly taken away through backflow of the liquid medium due to the temperature, thereby decreasing a sealing requirement for the heat dissipation apparatus, and ensuring a heat dissipation effect for the board.

DESCRIPTION OF EMBODIMENTS

To make the objectives, technical solutions, and advantages of this application clearer, the following further describes this application in detail with reference to the accompanying drawings.

For ease of understanding of a heat dissipation apparatus provided in the embodiments of this application, an application scenario of the heat dissipation apparatus is first described. The heat dissipation apparatus is configured to dissipate heat for a board 30. When a processor works, the board 30 in the processor generates a large amount of heat during operation. To ensure proper operation of the board 30, heat needs to be dissipated for the board 30. Therefore, an embodiment of this application provides a heat dissipation apparatus to dissipate heat for the board 30.

Figure 1:
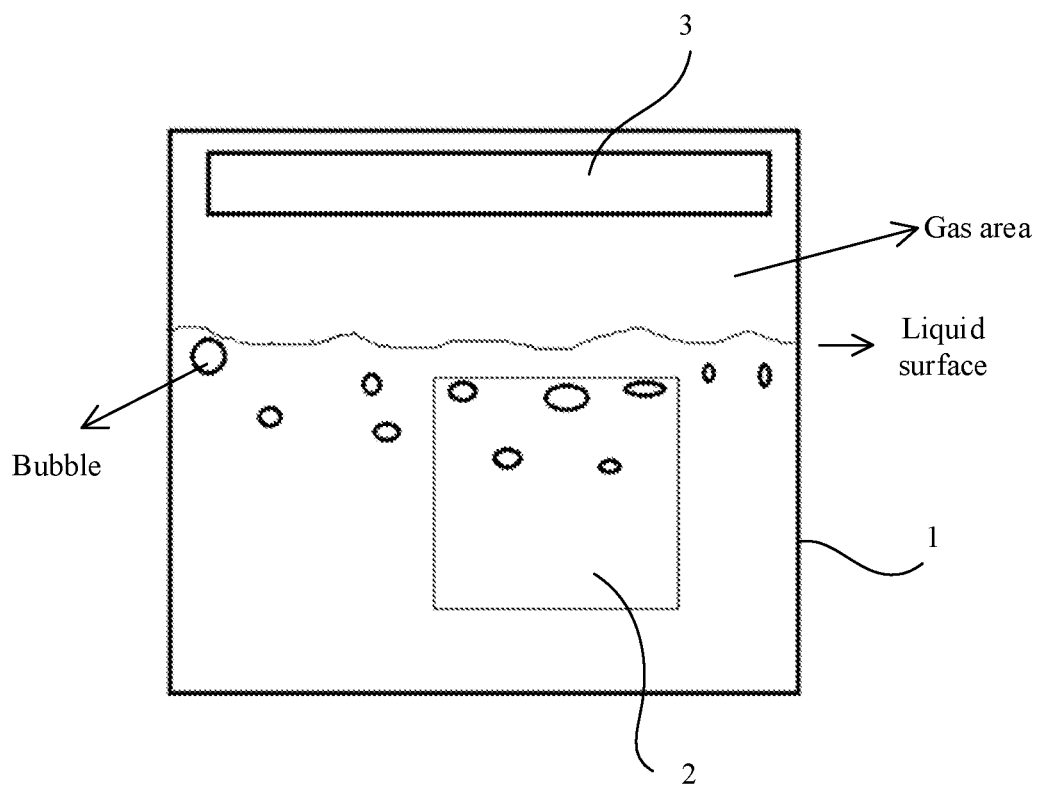
FIG. 1 is a schematic structural diagram of an immersion liquid-cooled heat dissipation apparatus of this application.
Figure 2:
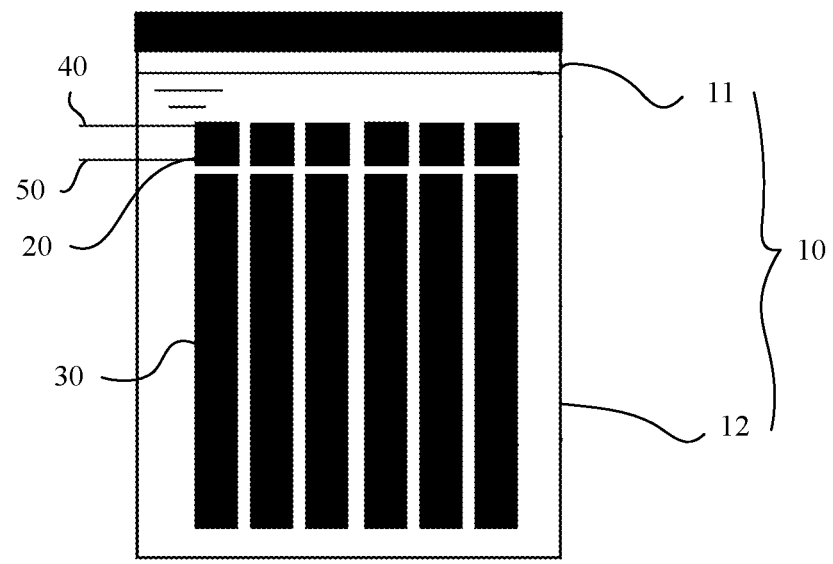
FIG. 2 is a schematic structural diagram of an immersion tank according to an embodiment of this application.

FIG. 2 shows a structure of a heat dissipation apparatus according to an embodiment of this application. The heat dissipation apparatus provided in this embodiment of this application includes an immersion tank 10. The immersion tank 10 is configured to carry a liquid medium and a board 30. A structure of the immersion tank 10 is shown in FIG. 2. The immersion tank 10 includes two parts. One part is a tank body 12 configured to accommodate the liquid medium and the board 30. The other part is a cover 11 connected to the tank body 12. During disposing of the tank body 12, the tank body 12 is of a tubular structure, for example, a cuboid-shaped, circular, or elliptical cylindrical structure or a tubular structure of another shape is used. When the liquid medium is being filled, an opening is provided on the tank body 12, and the liquid medium and the board 30 may be placed into the tank body 12 through the opening. Different media may be used as the liquid medium, for example, water, oil, or another liquid medium.

When the board 30 is carried, the board 30 is placed in the tank body 12 and is immersed in the liquid medium. To keep the board 30 in a stable posture in the liquid medium, when the board 30 is fastened in the tank body 12, disposing may be performed in different manners. For example, in an implementation solution, a slot 70 for fastening the board 30 is disposed in the tank body 12. When the board 30 is placed in the tank body 12, the board 30 is directly inserted into the slot 70 for fastening, and the board 30 is clamped and fastened by using a side wall of the slot 70. Alternatively, a fastener may be disposed in the slot 70, and the board 30 is fastened by using the fastener. When the fastener is used, the fastener may be disposed on the side wall of the slot 70, and the board 30 is fastened in the slot through clamping between the fastener and the board 30. Because the fastener is a comparatively common clamping structure, a structure of the fastener and a status of clamping between the fastener and the board 30 are not described in detail herein.

When the board 30 is being placed, a quantity of boards 30 may be determined according to an actual requirement. One board 30 may be disposed in the tank body 12, or two or more boards 30 may be disposed. Disposed slots are in a one-to-one correspondence with the quantity of boards 30. Therefore, there may also be one, two, or more slots 70. When two or more slots 70 are used, the two or more slots 70 are arranged in an array, for example, the slots are arranged in one or more rows. For ease of understanding of a manner of disposing the board 30 provided in this embodiment of this application, a structure shown in FIG. 2 is used as an example for description. Six boards 30 are disposed in the tank body 12 shown in FIG. 2, the six boards 30 are arranged in a single row, and the boards 30 are arranged in a direction parallel to a surface of the liquid medium. FIG. 2 merely shows a arrangement manner of the boards 30; the quantity of boards 30 provided in this embodiment of this application is not limited to six, and a different quantity of boards 30, such as five, seven, or ten boards 30, may alternatively be used. During arrangement, a different quantity of rows, such as two, three, or four rows, may be alternatively disposed based on space in the tank body 12. An arrangement manner of the boards 30 is limited by an arrangement manner of the slots 70. Therefore, when the boards 30 may be arranged in different manners, the corresponding slots 70 may also be arranged in different manners.

Still referring to FIG. 2, when a board 30 is fastened in a slot, to dissipate heat of the board 30 through the liquid medium as soon as possible, all sides of the disposed board 30 are in contact with the liquid medium. This is similar to that the board 30 is suspended in the liquid medium. In this way, a contact area between the liquid medium and the board 30 is increased, and a heat dissipation effect is improved. Certainly, in addition to the placement manner of the board 30 shown in FIG. 2, another manner may be alternatively used. For example, a bottom of the board 30 is in contact with a bottom of the tank body 12. Alternatively, another side may get in contact with the liquid medium to achieve a heat dissipation effect. Alternatively, the board 30 is fastened in the tank body 12 in another placement manner. However, in a implementation solution, the board 30 is disposed in a manner in which all sides are in contact with the liquid medium, so that heat generated by the board 30 can be absorbed by the liquid medium as soon as possible.

Figure 3:
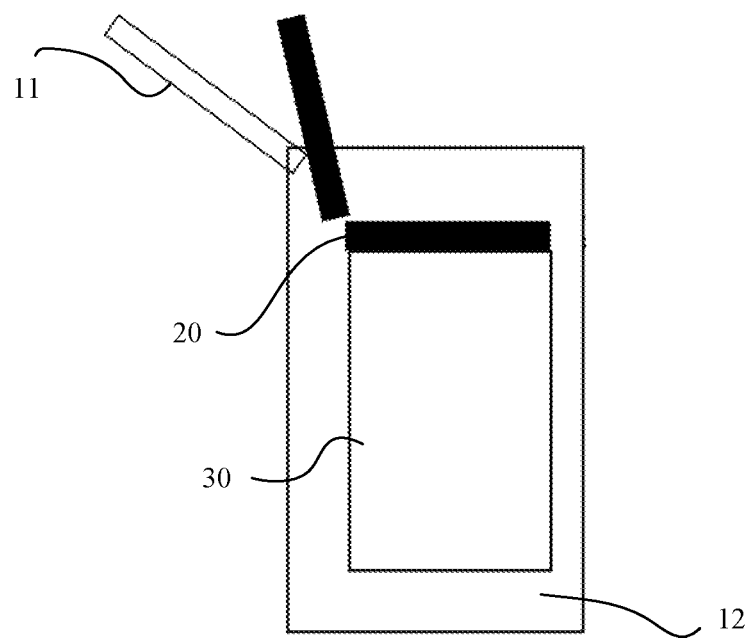
FIG. 3 is a schematic diagram of an open immersion tank according to an embodiment of this application.

To seal the opening on the tank body 12, the immersion tank 10 further includes a cover 11. The cover 11 covers the opening of the tank body 12. During disposing of the cover 11, the cover 11 and the tank body 12 may be of a split structure, or the cover 11 may be connected to the tank body 12 in a rotary manner. For example, when the split structure is used, the cover 11 and the tank body 12 may be connected by using a threaded connection or a fastener, so that the cover 11 covers the opening of the tank body 12 and is fastened. As shown in FIG. 3, when the rotary connection is used, the cover 11 and the tank body 12 are connected in a rotary manner at one end, and are fastened by using a fastener at the other end. When the fastener is buckled, the cover 11 covers the opening of the tank body 12. When the cover 11 covers the opening of the tank body 12, the cover 11 and the tank body 12 may be sealed or not sealed. For example, when sealing is performed, a sealing gasket may be disposed on the cover 11. When the cover 11 covers the opening of the tank body 12, the sealing gasket is used for sealing.

Certainly, regardless of which manner is used between the cover 11 and the tank body 12, the cover 11 can be opened to expose the opening of the tank body 12, so that the board 30 can be placed in the tank body 12 for fastening.

When heat is dissipated for the board 30 by using the heat dissipation structure provided in this embodiment of this application, in addition to the aforementioned liquid medium, a condenser 20 immersed in the liquid medium is further disposed. The condenser 20 is configured to dissipate heat for the liquid medium, so that the liquid medium can continuously absorb heat of the board 30. It can be learned from the foregoing descriptions that during heat transfer, heat is first transferred from the board 30 to the liquid medium, and then transferred from the liquid medium to the condenser 20. In an entire heat transfer process, the heat of the board 30 first heats up a liquid medium near the board 30, and after the liquid medium absorbs the heat, temperature of the liquid medium increases, and density of the liquid medium decreases. In addition, a liquid medium far away from the board 30 has comparatively low temperature and comparatively high density. Therefore, the liquid medium whose temperature increases rises, that is, the liquid medium located around the board 30 rises. When dissipating heat for the liquid medium, the disposed condenser 20 needs to cool the heated liquid medium. Therefore, when the condenser 20 is disposed, the condenser 20 is located above the board 30, and with respect to a structure of the immersion tank 10, the condenser 20 is located above the slot, so that heat can be dissipated for the rising liquid medium through the condenser 20 as soon as possible. It can be learned from the foregoing descriptions that in an entire heat dissipation process, a closed-loop flow is formed due to a temperature difference. An entire flow process is that: A liquid medium located around the board 30 absorbs heat, and temperature of the liquid medium increases; the liquid medium that has absorbed heat starts to rise; a liquid medium far away from the board 30 is filled around the board 30 to continue to dissipate heat for the board 30; the liquid medium that has absorbed heat continues to rise and gets in contact with the condenser 20, and performs heat exchange through the condenser 20; after the heat exchange, temperature of the liquid medium decreases, density increases, and the liquid medium starts to sink. In addition, the liquid medium far away from the board 30 flowing towards the board 30 also drives the cooled liquid medium to start to sink, so as to form an overall ring flow process from bottom to top and from top to bottom.

Figure 4:
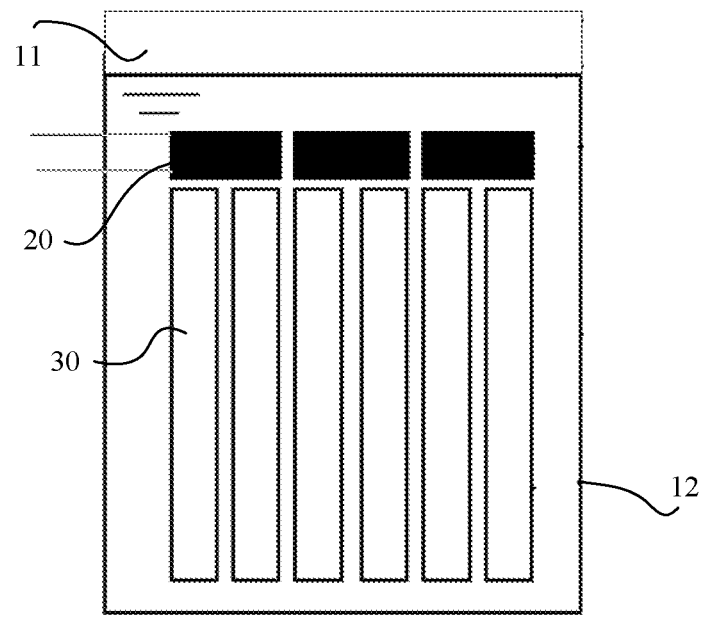
FIG. 4 is a schematic diagram of a correspondence between a condenser and a board according to an embodiment of this application.
Figure 5:
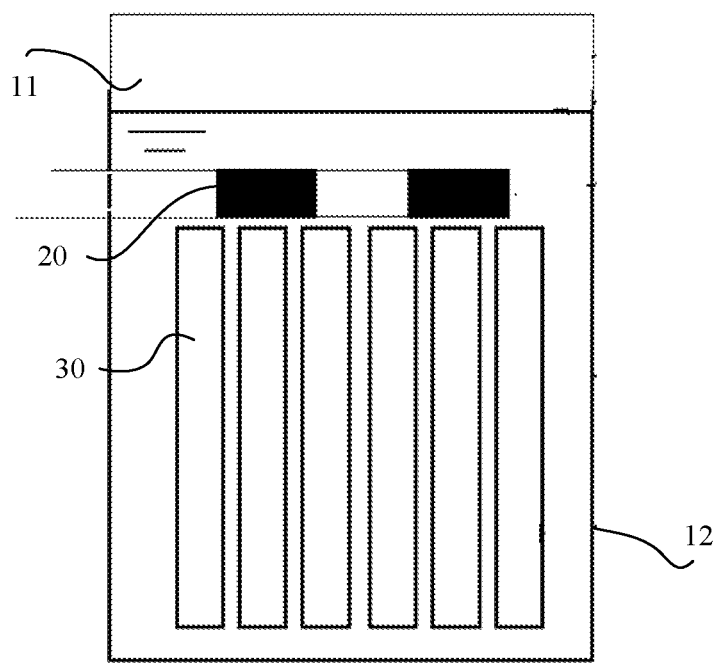
FIG. 5 is a schematic diagram of a correspondence between a condenser and a board according to an embodiment of this application.

In a correspondence between a condenser 20 and a board 30, one condenser 20 may correspond to one board 30, or one condenser 20 may correspond to two or more boards 30. A layout may be performed according to an actual heat dissipation requirement. As shown in FIG. 2, one condenser 20 corresponds to one board 30. However, FIG. 4 shows a disposing manner in which one condenser 20 corresponds to two boards 30. In addition, FIG. 5 shows a disposing manner in which one condenser 20 corresponds to three boards 30. Certainly, it should be understood that FIG. 2, FIG. 4, and FIG. 5 are merely examples of some implementations. A case of a correspondence between a board 30 and a condenser 20 provided in this embodiment of this application is not limited to the manners described above, and another different correspondence manner may be alternatively used as required. However, regardless of which correspondence manner is used, when the condenser 20 provided in this embodiment of this application absorbs heat, the condenser 20 needs to be located above the board 30. Therefore, each corresponding condenser 20 in this embodiment of this application is located above a corresponding slot 70, and each condenser 20 corresponds to at least one slot 70.

As shown in FIG. 2 and FIG. 3, when the board 30 works, the condenser 20 needs to be located above the board 30 to cool a liquid medium heated by the board 30. However, when the board 30 is being placed into the tank body 12, the condenser 20 needs to be moved away so as to insert the board into the slot 70 in the tank body 12. Therefore, during disposing of the condenser 20, the condenser 20 needs to be able to have two different states: When the board 30 is being inserted, the condenser 20 needs to be moved away to expose an opening of the slot 70; and after the board 30 is inserted, the condenser 20 needs to be located above the board 30 to dissipate heat for the board 30. Therefore, during disposing of the condenser 20 provided in this embodiment of this application, each condenser 20 may be connected to the tank body 12 in a rotary manner and may be locked at different specified locations. For example, when the condenser 20 rotates to a first specified location, the condenser 20 avoids the opening of the slot 70; or when the condenser 20 rotates to a second specified location, the condenser 20 blocks the opening of the slot 70. When the condenser 20 is connected to the tank body 12 in a rotary manner, one end of the condenser 20 is connected to a side wall of the tank body 12 in a rotary manner by using a damping shaft. In this case, when the condenser 20 rotates to the first specified location or the second specified location, locking may be implemented by using a damping effect of the damping shaft. Certainly, the condenser 20 may alternatively be locked by using a common combination of a fastener and a slot in the prior art. For example, a rotating shaft is fixedly connected to the condenser 20, a slot 70 is disposed on the rotating shaft, and an elastic protrusion is disposed in a shaft hole through which the rotating shaft passes, so that the condenser 20 is locked at different specified locations through cooperation between the elastic protrusion and the slot 70. Certainly, in addition to the foregoing manner of connecting the condenser 20 to the tank body 12 in a rotary manner, another manner may be alternatively used. For example, each condenser 20 is fixedly connected to the cover 11 of the immersion tank 10. The cover 11 is detachably connected to the tank body 12 in the manner described above. However, regardless of which connection manner is used, when the cover 11 is removed from the tank body 12, the condenser 20 can avoid the opening of the slot 70. As shown in FIG. 3, when the cover 11 is connected to the tank body 12 in a rotary manner, the condenser 20 is fastened on a side that is of the cover 11 and that faces the tank body 12. When the cover 11 is opened, the condenser 20 rotates with the cover 11, thereby avoiding the opening of the slot 70 and facilitating insertion of the board 30. When the cover 11 covers the tank body 12, the condenser 20 rotates with the cover 11 and is located above the board 30. When the condenser 20 is fastened on the cover 11, the condenser 20 may be connected to the cover 11 by using a bracket, so that when the cover 11 is connected to the tank body 12, the condenser 20 can be immersed in the liquid medium. It should be understood that the aforementioned manner in which the condenser 20 avoids the opening of the slot 70 is an illustrative embodiment, and the condenser 20 may be alternatively adjusted in another connection manner. For example, the condenser 20 may be adjusted to be in different locations by using a connecting rod component.

Figure 6:
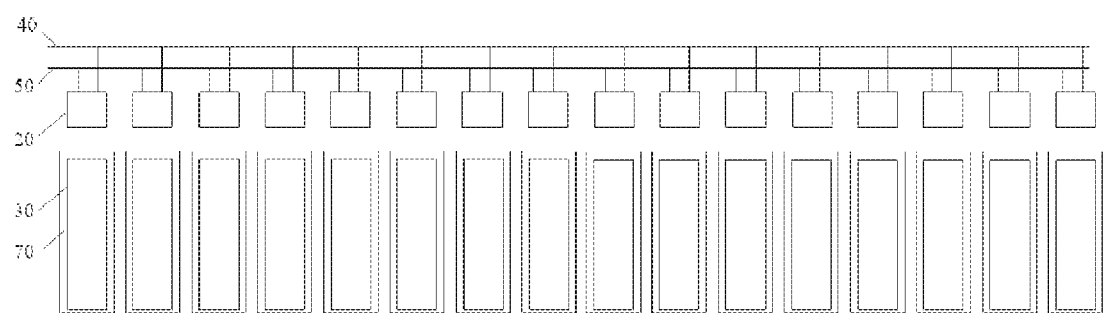
FIG. 6 is a schematic diagram of parallel condensers according to an embodiment of this application.
Figure 7:
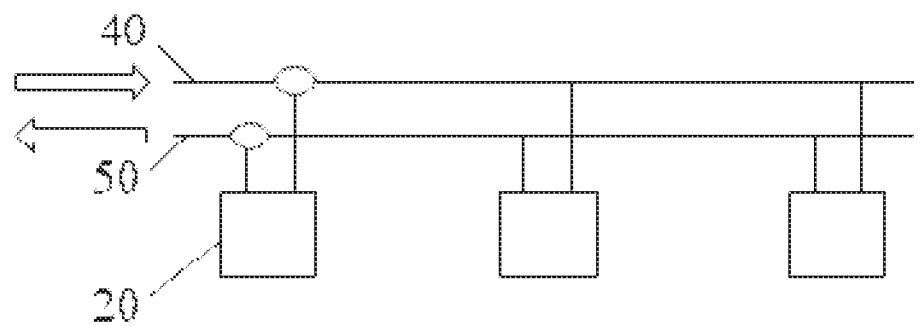
FIG. 7 is a schematic diagram of parallel condensers according to an embodiment of this application.

When the condenser 20 dissipates heat for the liquid medium, temperature of the condenser 20 also increases. To continuously dissipate heat, an embodiment of this application further provides a cooling apparatus 60. The disposed condenser 20 takes away and dissipates heat by using a cooling apparatus 60 that is connected to the condenser 20 and that is configured to perform heat exchange for the condenser 20. The condenser 20 may be connected to the cooling apparatus 60 in different manners. As shown in FIG. 6 and FIG. 7, the condenser 20 is connected to the cooling apparatus 60 by using a pipe. Specifically, a liquid inlet pipe 40 and a liquid outlet pipe 50 penetrate a side wall of the tank body 12. The liquid inlet pipe 40 is connected to a liquid inlet of the condenser 20. The liquid outlet pipe 50 is connected to a liquid outlet of the condenser 20. In addition, the liquid inlet pipe 40 and the liquid outlet pipe 50 are separately connected to the cooling apparatus 60. A liquid flows in the condenser 20 and the cooling apparatus 60 through the liquid inlet pipe 40 and the liquid outlet pipe 50 to form circulation, so as to dissipate heat. When there are two or more condensers 20, liquid inlets of the two or more condensers 20 are connected to the liquid inlet pipe 40 in parallel, and liquid outlets of the two or more condensers 20 are connected to the liquid outlet pipe 50 in parallel. A quantity of condensers 20 may be set to different quantities as required, for example, different quantities such as 3, 4, and 6. In FIG. 6, there are 16 condensers 20, and the 16 condensers 20 are connected to the liquid inlet pipe 40 and the liquid outlet pipe 50 in parallel. FIG. 7 shows three condensers 20, and the three condensers 20 are connected to the liquid inlet pipe 40 and the liquid outlet pipe 50 in parallel. The liquid inlet pipe 40 and the liquid outlet pipe 50 shown in FIG. 6 are not limited to penetrating the side wall of the tank body 12. Another manner may be alternatively used. For example, when the condenser 20 is fixedly connected to the cover 11, the liquid inlet pipe 40 and the liquid outlet pipe 50 separately penetrate the cover 11.

Figure 8:
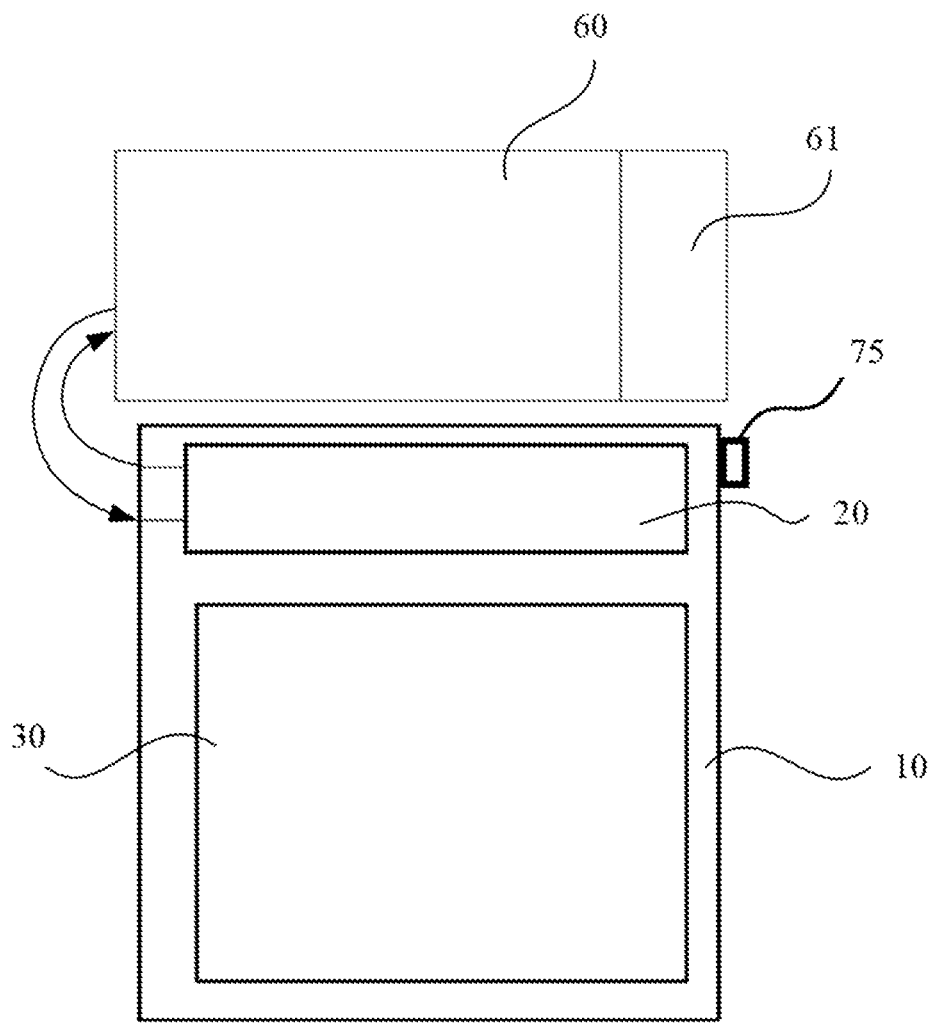
FIG. 8 is a schematic diagram of cooperation between a cooling apparatus and a condenser according to an embodiment of this application.

Different cooling apparatuses 60 may be used as the cooling apparatus 60. As shown in FIG. 8, a cooling apparatus 60 shown in FIG. 8 is an air-cooled heat dissipation module. The air-cooled heat dissipation module includes a fan 61. A pipe is disposed inside the air-cooled heat dissipation module to circulate a single-phase medium, and a pump is disposed on the pipe to drive the single-phase medium to circulate. Two ends of the pipe are respectively connected to the liquid inlet pipe 40 and the liquid outlet pipe 50, so as to form a loop with the pipe inside the condenser 20. After absorbing heat, the single-phase medium inside the condenser 20 flows into the air-cooled heat dissipation module for cooling by the fan 61, and then flows back to the condenser 20. Alternatively, a two-phase working medium may be used for the pipe, and the two-phase working medium naturally circulates under an action of gravity. In this case, the medium in the condenser 20 undergoes a phase change after absorbing heat, for example, the medium changes from a liquid state to a gas state, a gas medium enters the cooling apparatus 60 and changes to a liquid state through a phase change after being cooled by the fan 61, and a liquid medium flows back to the condenser 20 again.

Figure 9:
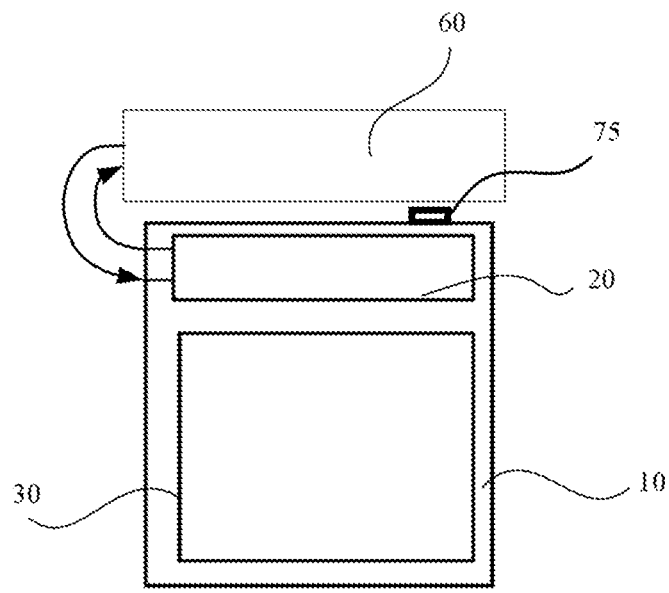
FIG. 9 is a schematic diagram of cooperation between a cooling apparatus and a condenser according to an embodiment of this application.

Certainly, in addition to the structure shown in FIG. 8, a structure shown in FIG. 9 may be alternatively used. A cooling apparatus 60 shown in FIG. 9 is a natural heat dissipation module. The natural heat dissipation module does not include a fan 61. Other structures are similar to those shown in FIG. 8. For a pipe connection manner and a heat dissipation manner inside the natural heat dissipation module, refer to the manner in FIG. 8. An only difference from FIG. 8 lies in that the cooling through the fan 61 in FIG. 8 is changed to cooling a medium through natural heat dissipation.

In addition to the structures shown in FIG. 8 and FIG. 9, the cooling apparatus 60 may alternatively cool the condenser 20 by using a different structure such as an outdoor dry cooler/cooling tower or an indoor chiller.

Figure 10:
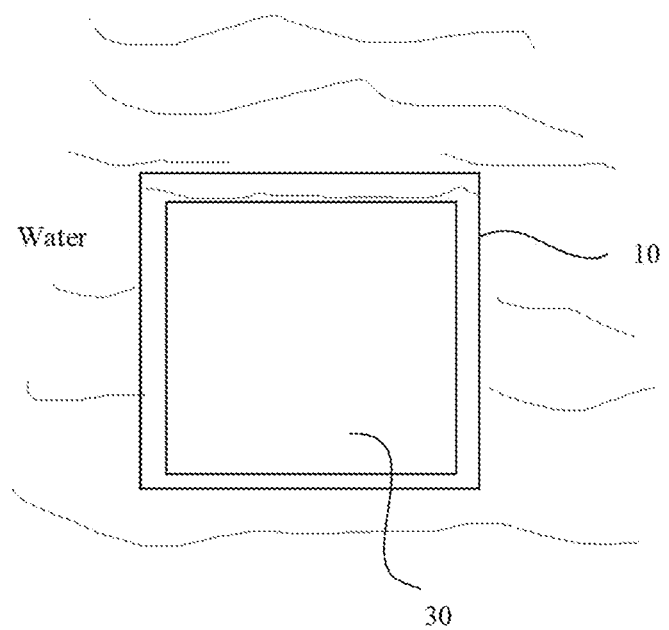
FIG. 10 is a schematic diagram of cooperation between a cooling apparatus and a condenser according to an embodiment of this application.

In addition to the foregoing described structures, another structure may be alternatively used for the condenser 20 and the cooling apparatus 60 provided in this embodiment of this application. As shown in FIG. 10, the condenser 20 may be alternatively an immersion tank 10, and a cooler is an external water source. In this case, heat absorbed by a liquid medium in the immersion tank 10 is transferred to the immersion tank 10, the immersion tank 10 is immersed in a water source, for example, immersed in a natural water source such as a river or a lake, or in an indoor cold water source, and the heat of the immersion tank 10 is absorbed by the external water source, so as to achieve an effect of dissipating heat for the board 30.

Figure 11:
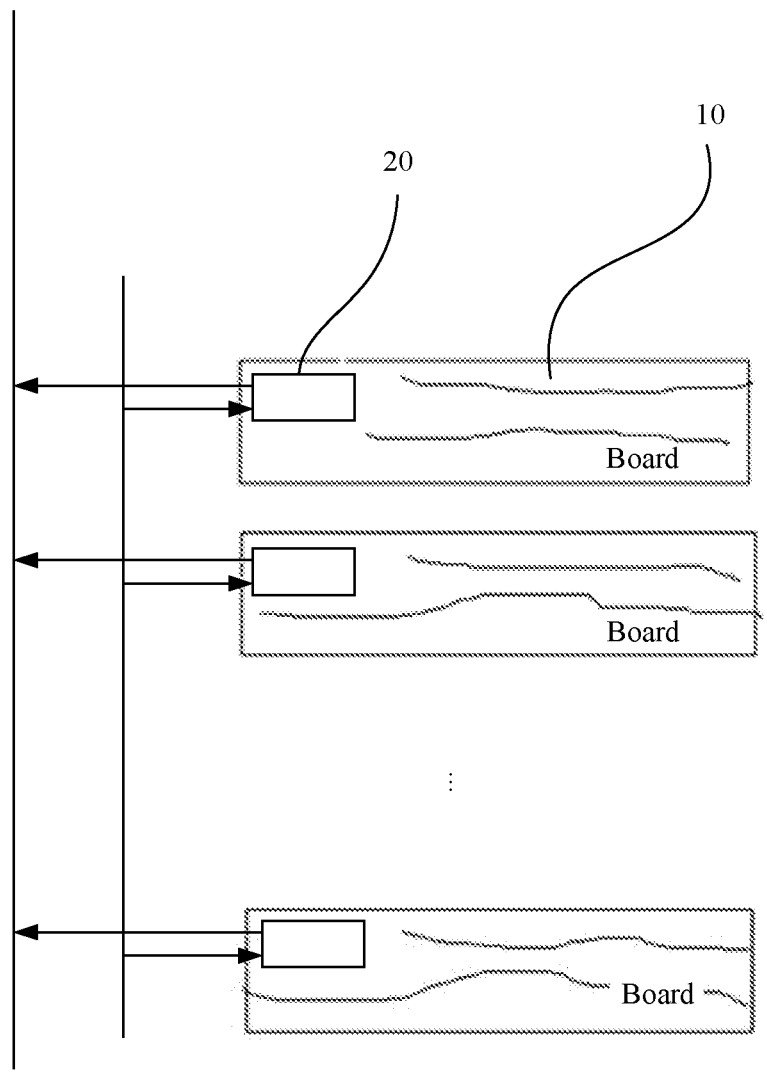
FIG. 11 is a schematic structural diagram of another heat dissipation apparatus according to an embodiment of this application.

In the foregoing examples, a manner in which a plurality of boards 30 are disposed in one immersion tank 10 is used for description. However, one board 30 may be alternatively disposed in the immersion tank 10. As shown in FIG. 11, one board 30 is disposed in each immersion tank 10. The immersion tank 10 and the board 30 are in a one-to-one correspondence, and a condenser 20 in the immersion tank 10 is connected to an external cooling apparatus 60 by using a pipe. In a structure shown in FIG. 11, a plurality of boards 30 correspond to a plurality of immersion tanks 10. This can also implement an effect of dissipating heat for the boards 30.

During disposing of the immersion tanks 10, regardless of whether the immersion tanks 10 and the boards 30 are disposed in a one-to-one manner, or are disposed in a one-to-many manner, when a liquid medium absorbs heat, a volume of the liquid medium increases, and in this case, pressure in the immersion tank 10 may be excessively high. Therefore, a safety valve 75 (FIGS. 8 and 9) is disposed on the immersion tank 10, to avoid a safety accident caused by excessive pressure in the immersion tank 10.

In addition, an embodiment of this application further provides a processor. The processor includes the heat dissipation apparatus according to any one of the foregoing implementations, and the board 30 inserted into the heat dissipation apparatus. After the board 30 generates heat, the heat heats up a liquid medium near the board 30. Density of the liquid medium decreases after the liquid medium is heated up, and the heated liquid medium rises. After the heated liquid medium gets in contact with a condenser 20, the heat is transferred to the condenser 20. After temperature of the liquid medium decreases, the density increases, and the liquid medium sinks to a tank bottom again. In this way, a "natural convection" cycle is formed by using a change relationship between the density and the temperature of the liquid medium, and heat of the board 30 is continuously transferred to the condenser 20 in the immersion tank 10 by using the liquid medium in the immersion tank 10 as a medium. Then the condenser 20 takes away and dissipates the heat by using a cooling apparatus 60 that is connected to the condenser 20 and that is configured to perform heat exchange for the condenser 20. It can be learned from the foregoing descriptions that in the foregoing embodiment, the heat is directly taken away through backflow of the liquid medium due to the temperature, thereby decreasing a sealing requirement for the heat dissipation apparatus, and ensuring a heat dissipation effect for the board 30.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A heat dissipation apparatus, comprising:
   an immersion tank including:
   a tank body;
   a cover;
   a safety valve; and
   a plurality of slots disposed in the tank body, each slot being configured to receive at least one board;
   a liquid medium disposed in the immersion tank to immerse each of the boards received within each slot, each slot being in fluid communication with an interior portion of the immersion tank to permit immersion in the liquid medium of all boards received within the tank body to dissipate heat from each board;
   a plurality of condensers received within the immersion tank and positioned above each slot, each of the plurality of condensers being immersed in the liquid medium to cool and to condense heated gaseous medium generated by each board at a first temperature to a second temperature liquid during operation of the heat dissipation apparatus, the first temperature being greater than the second temperature; and
   a cooling apparatus connected to each of the plurality of condensers to extract heat from the liquid received from the plurality of condensers, wherein:
   a single, common liquid inlet and a single, common liquid outlet is provided to each of the plurality of condensers the single common liquid inlet being connected to a first end of a liquid inlet pipe and the single common liquid outlet being connected to a first end of a liquid outlet pipe, a second end of each of the liquid inlet and liquid outlet pipe of each of the plurality of condensers being connected to the cooling apparatus;
   the safety valve is configured to release excessive pressure from the immersion tank;
   wherein the cover is secured to the tank body in a rotary manner and each of the plurality of condensers is connected to an underside of the cover such that, when the cover is rotatably displaced relative to the tank body, each of the plurality of condensers is rotatably displaced from an open end of the corresponding slot.

2. The heat dissipation apparatus according to claim 1, wherein:
   the liquid inlet pipe is connected to the liquid inlet of each of the plurality condensers by penetrating a wall of the immersion tank; and
   the liquid outlet pipe is connected to the liquid outlet of each of the plurality condensers by penetrating the wall of the immersion tank.

3. The heat dissipation apparatus according to claim 2, liquid inlets of each of the plurality of condensers being connected to the liquid inlet pipe in parallel, liquid outlets of each of the plurality of condensers being connected in parallel to the liquid outlet pipe.

4. The heat dissipation apparatus according to claim 1, wherein the immersion tank comprises two or more slots arranged in an array.

5. The heat dissipation apparatus according to claim 2, wherein the cooling apparatus is selected from at least one of an outdoor dry cooler, a cooling tower and an indoor chiller.

6. A processor, comprising,
a heat dissipation apparatus including:
an immersion tank comprising:
a tank body;
a cover;
a safety valve; and
a plurality of slots disposed in the tank body and configured to receive at least one board;
a liquid medium disposed in the immersion tank to immerse each of the boards received within each slot, each slot being in fluid communication with an interior portion of the immersion tank to permit immersion in the liquid medium of all boards received within the tank body to dissipate heat from each board;
a plurality of condensers received within the immersion tank and positioned above each slot, each of the plurality of condensers being immersed in the liquid medium to cool and to condense heated gaseous medium generated by each board at a first temperature to a second temperature liquid during operation of the heat dissipation apparatus, the first temperature being greater than the second temperature; and
a cooling apparatus connected to each of the plurality of condensers to extract heat from the liquid received from the plurality of condensers, wherein:
a single, common liquid inlet and a single, common liquid outlet is provided to each of the plurality of condensers the single common liquid inlet being connected to a first end of a liquid inlet pipe and the single common liquid outlet being connected to a first end of a liquid outlet pipe, a second end of each of the liquid inlet and liquid outlet pipe of each of the plurality of condensers being connected to the cooling apparatus;
the safety valve is configured to release excessive pressure from the immersion tank;
wherein the cover is secured to the tank body in a rotary manner and each of the plurality of condensers is connected to an underside of the cover such that, when the cover is rotatably displaced relative to the tank body, each of the plurality of condensers is rotatably displaced from an open end of the corresponding slot.

7. The processor according to claim 6, wherein:
the liquid inlet pipe is connected to the liquid inlet of each of the plurality of condensers by penetrating the immersion tank; and
the liquid outlet pipe is connected to the liquid outlet of each of the plurality of condensers by penetrating the immersion tank.

8. The processor according to claim 6, liquid inlets of each of the plurality of condensers being connected to the liquid inlet pipe in parallel and liquid outlets of each of the plurality of condensers being connected to the liquid outlet pipe in parallel.

9. The processor according to claim 6, wherein each of the plurality of condensers is fixedly connected to the cover of the immersion tank.

10. The heat dissipation apparatus according to claim 6, wherein an equal number of condensers and slots is provided, the condensers and slots being arranged in a 1:1 relationship, each of the condensers being positioned above a corresponding slot.

11. The heat dissipation apparatus according to claim 6, wherein the immersion tank comprises two or more slots arranged in an array.

12. A heat dissipation apparatus, comprising:
an immersion tank and a liquid medium disposed in the immersion tank, the immersion tank comprising a tank body having an open end and a cover extending across the open end;
a plurality of slots disposed in the immersion tank and including a fastener to secure an electronic component received within the slot;
a plurality of condensers immersed in the liquid medium, each of the plurality of condensers corresponding to at least one slot and positioned above an open end of the slot;
a cooling apparatus connected to each condenser; and
a liquid inlet pipe and a liquid outlet pipe that extend through the immersion tank, the liquid inlet pipe being connected to a liquid inlet of each of the plurality of condensers, and the liquid outlet pipe being connected to a liquid outlet of each of the plurality of condensers, the liquid inlet pipe and liquid outlet pipe being separately connected to the cooling apparatus to establish a circulatory path between each condenser and the cooling apparatus, the cooling apparatus performing heat exchange for each of the plurality of condensers;
wherein the cover is secured to the tank body in a rotary manner and each of the plurality of condensers is connected to an underside of the cover such that, when the cover is rotatably displaced relative to the tank body, each of the plurality of condensers is rotatably displaced from the open end of the corresponding slot.

13. The heat dissipation apparatus according to claim 12, further comprising a safety valve to release excessive pressure from the immersion tank.

14. The heat dissipation apparatus according to claim 12, further comprising a fan assembly connected to the cooling apparatus to facilitate cooling of fluid carried by the liquid outlet through the cooling apparatus for return to the plurality of condensers via the liquid inlet pipe.

* * * * *